United States Patent
He et al.

(10) Patent No.: US 9,429,836 B2
(45) Date of Patent: Aug. 30, 2016

(54) EXPOSURE MASK, EXPOSURE APPARATUS, AND METHOD FOR MANUFACTURING DISPLAY SUBSTRATE

(71) Applicant: BOE TECHNOLOGY GROUP CO., LTD., Beijing (CN)

(72) Inventors: Xuan He, Beijing (CN); Wei Guo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 59 days.

(21) Appl. No.: 14/445,624

(22) Filed: Jul. 29, 2014

(65) Prior Publication Data

US 2015/0293439 A1 Oct. 15, 2015

(30) Foreign Application Priority Data

Apr. 9, 2014 (CN) .......................... 2014 1 0141112

(51) Int. Cl.
 *G03F 1/38* (2012.01)
 *G03F 7/30* (2006.01)
(52) U.S. Cl.
 CPC .. *G03F 1/38* (2013.01); *G03F 7/30* (2013.01)
(58) Field of Classification Search
 CPC .................................. G03F 1/38; G03F 7/30
 USPC ............................................ 430/5, 320, 321
 See application file for complete search history.

(56) References Cited

U.S. PATENT DOCUMENTS

2015/0293440 A1* 10/2015 Kim .......................... G03F 1/38
 430/5

FOREIGN PATENT DOCUMENTS

| CN | 1375745 | A | 10/2002 |
| CN | 1414430 | A | 4/2003 |
| CN | 103365112 | A | 10/2013 |
| CN | 103558712 | A | 2/2014 |
| JP | 2007049026 | A | 2/2007 |

OTHER PUBLICATIONS

Office Action issued in Chinese Application No. 201410141112.9 issued Jun. 2, 2015.

\* cited by examiner

*Primary Examiner* — Christopher Young
(74) *Attorney, Agent, or Firm* — Nath, Goldberg & Meyer; Joshua B. Goldberg

(57) ABSTRACT

The present invention discloses an exposure mask, an exposure apparatus, and a method for manufacturing a display substrate, which are used for forming a pattern with a smaller aperture, a narrower slit, or a line of smaller width on a photoresist layer. The exposure mask includes a mask body and an anti-diffraction film layer located at a light emergent side of the mask body. Wherein the mask body includes a light transmissive region and a light non-transmissive region; a region of the anti-diffraction film layer which corresponds to at least the light transmissive region of the mask body is a light transmissive region; and the anti-diffraction film layer is a film layer whose refractive index n satisfies n>1.

15 Claims, 2 Drawing Sheets

EXPOSURE MASK, EXPOSURE APPARATUS, AND METHOD FOR MANUFACTURING DISPLAY SUBSTRATE

FIELD OF THE INVENTION

The present invention relates to the field of display technology, in particular, relates to an exposure mask, an exposure apparatus, and a method for manufacturing a display substrate.

BACKGROUND OF THE INVENTION

In the field of display technology, a display substrate mainly includes a color-film substrate and an array substrate which are arranged by aligning and assembling. There is mainly a color filter (i.e., a patternized color resin layer for manufacturing a color filter) provided on the color-film substrate, and there is mainly a pixel array provided on the array substrate. In recent years, as people's demand for a display panel of high aperture ratio and high brightness increases, a technology in which a color filter is directly formed on an array substrate (Color filter On Array, which is simply referred to as COA). A color filter array substrate formed by the COA technology is referred to as a COA substrate.

Both manufacture of a color-film substrate and manufacture of a COA substrate include a procedure of manufacturing a color filter, a procedure of manufacturing a black matrix, and a procedure of manufacturing a via in a color resin layer for manufacturing a color filter. The color filter, the black matrix, and the color resin layer for manufacturing a color filter are all photoresist layers.

In the prior art, when a color filter, a black matrix, or a via is formed on a photoresist layer, a resin layer is exposed to light by using a mask corresponding to a pattern, and then the exposed resin layer is developed to obtain the pattern. During exposure, the mask is located on an exposure apparatus, and the exposure apparatus is moved to make the mask be close to a photoresist layer to be exposed (i.e., exposure is performed by using a large area proximity exposure mode), to obtain a black matrix having a certain line width, a slit between adjacent color filters, or an aperture having a certain width.

In the prior art, a mask generally has a single-layer structure, and the mask is provided with a light transmissive region and a light non-transmissive region. Since the minimum distance between an apparatus and a film layer to be exposed is about 300 μm, exposure light will experience a diffraction phenomenon during passing through a slit or a via to irradiate a photoresist layer under the mask, so that an exposed region on the photoresist layer is larger than the light transmissive region of the mask. Thus, the size of the resultant aperture, slit, or black matrix is larger.

As the number of pixels of a display increases, a demand for graphic fineness increases. In the prior art, the fineness of a pattern obtained by forming a color filter, a black matrix, or a via on a photoresist layer has failed to meet requirements, because application the pattern obtained in such a way to a display product will limit the aperture ratio of a pixel.

SUMMARY OF THE INVENTION

The present invention provides an exposure mask, an exposure apparatus, and a method for manufacturing a display substrate, which are used for forming a pattern with a smaller aperture, a narrower slit, or a line of smaller width on a photoresist layer, thereby improving the aperture ratio of a pixel on a display substrate.

Embodiments of the present invention provide an exposure mask including a mask body and an anti-diffraction film layer located at a light emergent side of the mask body, wherein, the mask body includes a light transmissive region and a light non-transmissive region;

a region of the anti-diffraction film layer which corresponds to at least the light transmissive region of the mask body is a light transmissive region; and the anti-diffraction film layer is a film layer whose refractive index n satisfies $n>1$.

Preferably, a refractive index n of the light transmissive region of the anti-diffraction film layer satisfies $1<n\leq 10$.

Preferably, the refractive index n of the light transmissive region of the anti-diffraction film layer satisfies $1<n\leq 2$.

Preferably, the anti-diffraction film layer is detachably connected to the mask body.

Preferably, a thickness of the anti-diffraction film layer ranges from 1 μm to 300 μm.

Preferably, the anti-diffraction film layer is an organic resin layer.

Preferably, a distance between the anti-diffraction film layer and the mask body ranges from 50 μm to 200 μm.

The present invention further provides a method for manufacturing a display substrate, wherein the method includes the following steps:

a step of forming a photoresist layer on a substrate;

a step of placing an exposure mask corresponding to a pattern to be formed on the photoresist layer above the photoresist layer;

a step of exposing the photoresist layer to light by using an exposure apparatus, so that light emitted from the exposure apparatus passes through a light incident side and a light emergent side of the exposure mask and the photoresist layer successively; and a step of forming the pattern on the exposed photoresist layer by a development process;

wherein, the exposure mask is any one of the above exposure masks.

Preferably, the step of forming a photoresist layer on a substrate includes: forming a black resin layer or a color resin layer for manufacturing a color filter on the substrate.

Preferably, in a case of forming a black resin layer on the substrate, the step of placing an exposure mask corresponding to a pattern to be formed on the photoresist layer above the photoresist layer includes: placing an exposure mask corresponding to a pattern of a black matrix to be formed above the substrate on which the black resin layer is formed, so that a region of the mask body of the exposure mask which corresponds to the pattern of the black matrix to be formed is a light transmissive region, and the remaining region of the mask body of the exposure mask is a light non-transmissive region;

the step of exposing the photoresist layer to light by using an exposure apparatus includes: exposing the black resin layer to light by using the exposure apparatus; and the step of forming the pattern on the exposed photoresist layer by a development process includes: performing a development process on the exposed black resin layer to form the pattern of the black matrix;

in a case of forming a color resin layer for manufacturing a color filter on the substrate, the step of placing an exposure mask corresponding to a pattern to be formed on the photoresist layer above the photoresist layer includes: placing an exposure mask corresponding to a pattern of a color filter to be formed above the substrate on which the color resin layer for manufacturing a color filter is formed, so that a region of the mask body of the exposure mask which corresponds to the pattern of the color filter to be formed is a light transmissive region, and the remaining region of the mask body of the exposure mask is a light non-transmissive region;

the step of exposing the photoresist layer to light by using an exposure apparatus includes: exposing the color resin layer for manufacturing a color filter to light by using the exposure apparatus; and the step of forming the pattern on the exposed photoresist layer by a development process includes: performing a development process on the exposed color resin layer for manufacturing a color filter to form the pattern of the color filter.

The present invention further provides an exposure apparatus on which an exposure mask is arranged, wherein the exposure mask is any one of the above exposure masks.

In summary, in the exposure mask according to the present invention, when an exposure apparatus performs exposure on a photoresist layer located under the exposure mask, light passes through a mask body, an anti-diffraction film layer, and a photoresist layer successively. When light passes through the anti-diffraction film layer, little or no diffraction phenomenon will occur, so that an area of a pattern formed on the exposed photoresist layer is equal to or substantively equal to an area of the light transmissive region of the mask body. Thus, the fineness of a pattern obtained after exposure is higher. Correspondingly, an aperture formed on a photoresist layer is smaller, a slit formed on a photoresist layer is narrower, or a line formed on a photoresist layer has a smaller width, thereby improving the aperture ratio of a pixel on a display substrate.

DETAILED DESCRIPTION OF THE EMBODIMENTS

Embodiments of the present invention provides an exposure mask, an exposure apparatus, and a method for manufacturing a display substrate, which are used for forming a pattern with a smaller aperture, a narrower slit, or a line of smaller width on a photoresist layer, thereby improving the aperture ratio of a pixel on a display substrate.

It should be noted that, the principle of a development process is to dissolve a resin by using a developer. In the present invention, both an unexposed portion of a black resin layer and an unexposed portion of a color resin layer for manufacturing a color filter as described below can be dissolved by a developer.

The black resin layer mainly consists of an alkali-soluble resin, a black pigment, and a photopolymerization initiator. The color resin layer for manufacturing a color filter mainly consists of an alkali-soluble resin, a color pigment, and a photopolymerization initiator.

The technical solutions provided by embodiments of the present invention will be described in detail with reference to the drawings.

Figure 1:
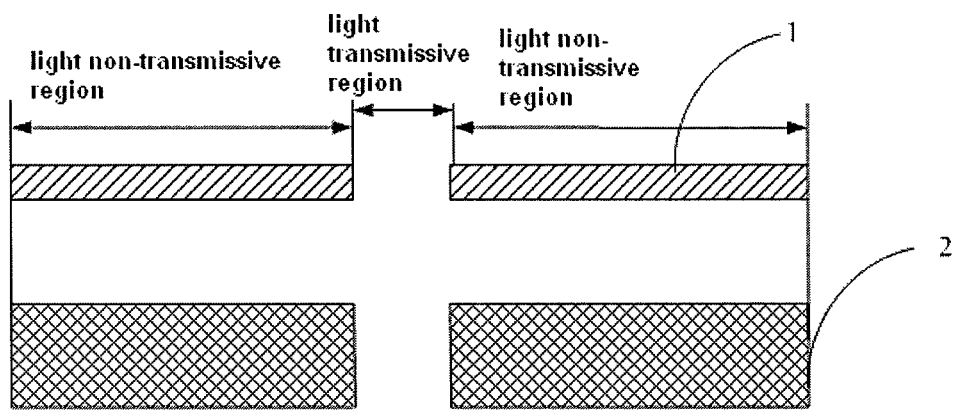
FIG. 1 is a schematic view of the structure of the exposure mask according to an embodiment of the present invention.

FIG. 1 shows the exposure mask according to an embodiment of the present invention. The exposure mask includes: a mask body 1 and an anti-diffraction film layer 2 located at a light emergent side of the mask body 1, the anti-diffraction film layer 2 being used for preventing light from diffracting; wherein, the mask body 1 includes a light transmissive region and a light non-transmissive region;

a region of the anti-diffraction film layer 2 which corresponds to at least the light transmissive region of the mask body 1 is a light transmissive region; and the anti-diffraction film layer 2 is a film layer whose refractive index n satisfies n>1.

Specifically, the mask body 1 is any mask structure having a light transmissive region and a light non-transmissive region. The mask body 1 according to an embodiment of the present invention mainly refers to a structure having a hole-like transmissive region or a slit-like transmissive region, and a target pattern after exposure is a via, a slit, a line (one example of which is a black matrix), or the like.

The anti-diffraction film layer 2 is a film layer whose refractive index n satisfies n>1.

Generally, an exposure process is perform in the air, and the reflective index $n_{air}$ of the air satisfies $n_{air}=1$.

Figure 2:
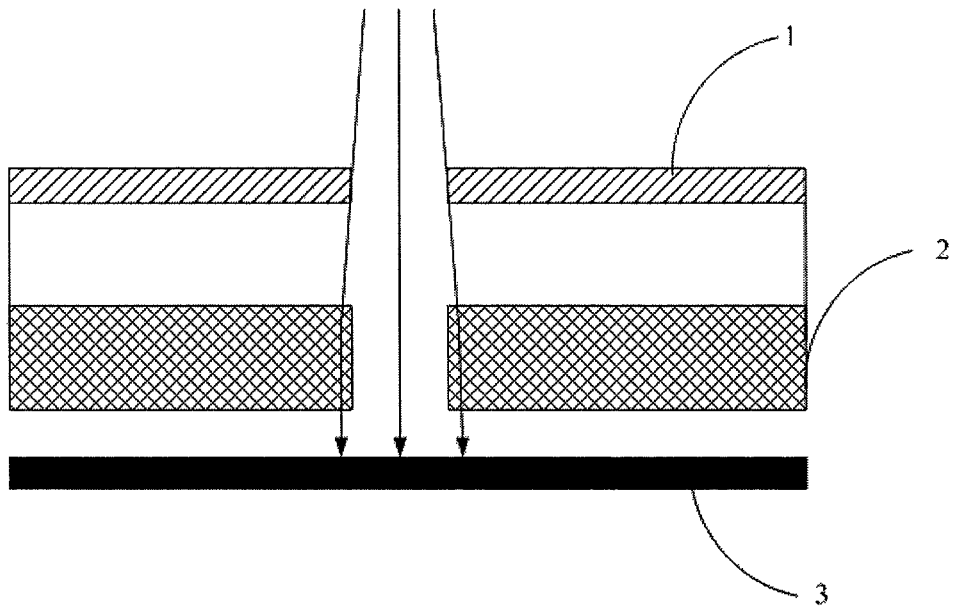
FIG. 2 is a schematic view of the light path of the exposure mask according to an embodiment of the present invention when exposure is performed.

In a procedure of performing exposure by using the above exposure mask as shown in FIG. 1, an exposure apparatus is located above the mask body 1, and a film layer 3 (e.g., a film layer of black matrix (BM)) to be exposed is located under the anti-diffraction film layer 2, as shown in FIG. 2. When exposure is performed, light (as indicated by the unidirectional arrows shown in FIG. 2) emitted from the exposure apparatus successively passes through the light transmissive regions of the mask body 1 and the anti-diffraction film layer 2 from a light incident side of the mask body 1, and then irradiates the film layer 3 to be exposed. Since a pattern of the light transmissive region of the mask body 1 is hole-like or slit-like, light easily experiences a diffraction phenomenon when passing therethrough. When light passes through the mask body 1 and the anti-diffraction film layer 2 successively, since the refractive index n of the anti-diffraction film layer 2 satisfies n>1 (i.e., the refractive index of the anti-diffraction film layer 2 is larger than that of the air), light has an effect of converging towards the light transmissive region after passing through the anti-diffraction film layer 2. Compared with the prior art where light directly irradiates a film layer to be exposed after passing through a mask body, the exposure mask according to the present invention can reduce the area of an exposed region of the film layer 3 to be exposed after exposure. Correspondingly, a resultant aperture is smaller, a resultant slit is narrower, or a resultant line has a smaller width, so that the fineness of a resultant pattern is higher. Therefore, the resolution of an image displayed by a display device can be improved.

The larger the reflective index of the anti-diffraction film layer is, the larger the distance by which light moves towards the center of the light transmissive region is; and the larger the thickness of the anti-diffraction film layer is, the larger the distance by which light moves towards the center of the light transmissive region is. In such cases, a resultant aperture is smaller, a resultant slit is narrower, or a resultant line has a smaller width.

Figure 3:
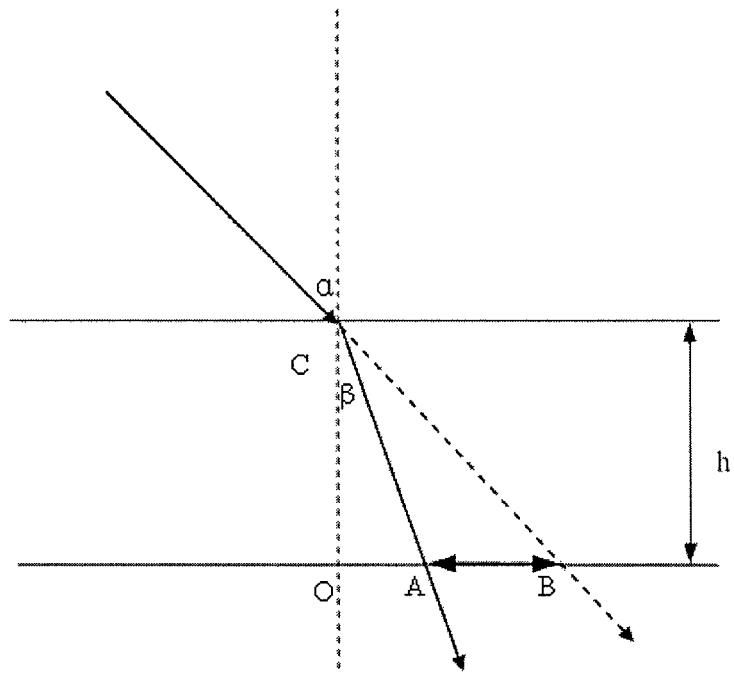
FIG. 3 is an enlarged schematic view of the light path in an anti-diffraction film layer of the exposure mask shown in FIG. 2.

Specifically, FIG. 3 is an enlarged schematic view of the light path in the anti-diffraction film layer 2 of the exposure mask shown in FIG. 2.

The following equations (1-1) and (1-2) hold according to geometrical relations and by assuming that the thickness of the anti-diffraction film layer 2 is h, an incident angle of light incident on a surface of the anti-diffraction film layer 2 is α, an incident point is point C, an emergent point of emergent light is point A, a dashed line with an arrow is a reference line (i.e., a direction in which light propagates in the air), and the distance between emergent light and the reference line on the light emergent surface of the anti-diffraction film layer 2 is AB:

$$AB = h*(\tan\alpha - \tan\beta) \quad (1-1)$$

$$n = \sin\alpha/\sin\beta \quad (1-2)$$

Wherein β is the refraction angle of light in the anti-diffraction film layer 2, n is the reflective index of the anti-diffraction film layer 2, and h, α, and n are all known.

The following equation (1-3) can be obtained from the equations (1-1) and (1-2):

$$AB = h*(\tan\alpha - \tan\beta) = h*\left(\tan\alpha - \frac{\sin\alpha}{\sqrt{n^2 - \sin^2\alpha}}\right). \quad (1-3)$$

It can be seen from the equation (1-3) that the greater the reflective index n of the anti-diffraction film layer 2 is, the larger a deflection angle of light is, so that the larger the distance AB by which light moves towards the center of the light transmissive region is; and the greater the thickness h of the anti-diffraction film layer 2 is, the larger the distance AB by which light moves towards the center of the light transmissive region is.

In the exposure mask shown in FIG. 1, the reflective index n of the light transmissive region of the anti-diffraction film layer 2 may be 1~100 (wherein 1 is excluded).

Preferably, in the exposure mask shown in FIG. 1, the refractive index n of the light transmissive region of the anti-diffraction film layer 2 satisfies 1<n≤10.

More preferably, in the exposure mask shown in FIG. 1, the refractive index n of the light transmissive region of the anti-diffraction film layer 2 satisfies 1<n≤2.

When an exposure process is performed by using a mask in the prior art, the minimum distance between a mask body and a film layer to be exposed is about 300 μm.

In the present invention, preferably, the thickness of the anti-diffraction film layer 2 may be 1~300 μm (i.e., the maximum thickness of the anti-diffraction film layer 2 does not exceed the distance between the mask body 1 and the film layer 3 to be exposed). More preferably, the thickness of the anti-diffraction film layer 2 is 1~200 μm. Even more preferably, the thickness of the anti-diffraction film layer 2 is 1~100 μm.

When the thickness of the anti-diffraction film layer 2 is smaller than the distance between the mask body 1 and the film layer 3 to be exposed, the distance between the anti-diffraction film layer 2 and the mask body 1 is preferably 0~200 μm, and more preferably 50~200 μm.

Furthermore, the anti-diffraction film layer 2 may be an organic resin layer. Specifically, the organic resin layer is a non-colloidal organic resin layer having a certain hardness. For example, in a specific embodiment, a cured organic resin layer can be obtained by but not limited to curing a colloidal organic resin layer by a light curing process.

Modes for implementing the anti-diffraction film layer 2 of the exposure mask shown in FIG. 1 are various. For example, one implementing mode is that the whole film layer is a light transmissive film layer. Another implementing mode is that a light transmissive region is provided at a region corresponding to the light transmissive region of the mask body 1.

In the exposure mask according to the present invention shown in FIG. 1, the anti-diffraction film layer 2 may be detachably or fixedly connected to the mask body 1. When the anti-diffraction film layer 2 is a film layer whose entirety is light transmissive, the anti-diffraction film layer 2 is for general purpose, i.e., is applicable to different mask bodies 1 whose overall dimensions are adapted to that of the anti-diffraction film layer 2. In this case, the anti-diffraction film layer 2 is detachably connected to the mask body 1, so that a single anti-diffraction film layer 2 can be applied to different mask bodies 1 repeatedly.

An implementing mode of detachable connection may be but not limited to a snap connection or an inserting and matching connection.

Embodiments of the present invention further provide an exposure apparatus on which an exposure mask is arranged, wherein the exposure mask is any one of the exposure masks provided by the above embodiments.

Figure 4:
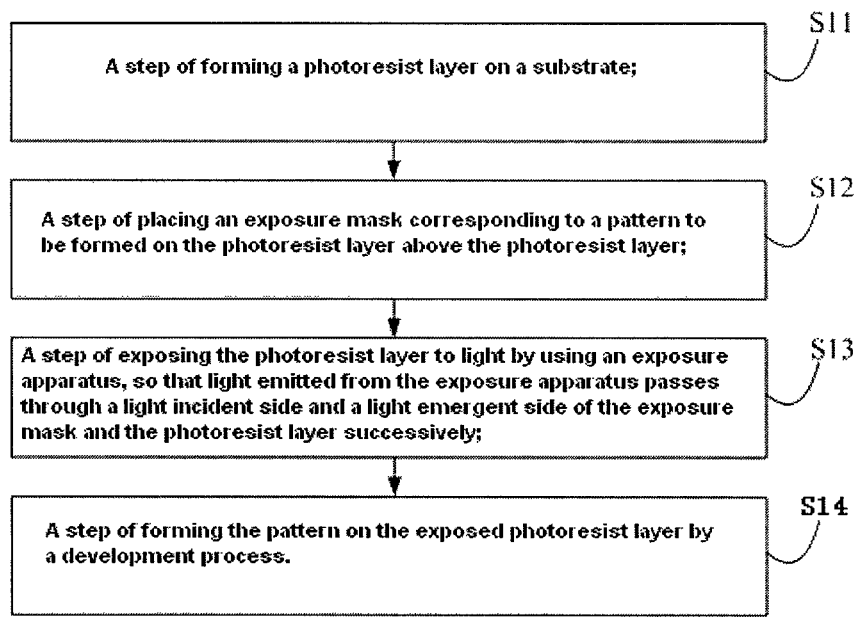
FIG. 4 is a schematic flow chart of the method for manufacturing a display substrate according to an embodiment of the present invention.

Referring to FIG. 4, embodiments of the present invention further provides a method for manufacturing a display substrate. The method includes the following steps:

S11: a step of forming a photoresist layer on a substrate;

S12: a step of placing an exposure mask corresponding to a pattern to be formed on the photoresist layer above the photoresist layer;

S13: a step of exposing the photoresist layer to light by using an exposure apparatus, so that light emitted from the exposure apparatus passes through a light incident side and a light emergent side of the exposure mask and the photoresist layer successively; and S14: a step of forming the pattern on the exposed photoresist layer by a development process;

wherein, the exposure mask is any one of the above exposure masks.

Referring to FIG. 2, an exposure apparatus is located above the mask body 1, and a film layer 3 (e.g., a film layer of black matrix (BM)) to be exposed is located under the anti-diffraction film layer 2. When exposure is performed, light (as indicated by the unidirectional arrows shown in FIG. 2) emitted from the exposure apparatus successively passes through the light transmissive regions of the mask body 1 and the anti-diffraction film layer 2 from a light incident side of the mask body 1, and then irradiates the film layer 3 to be exposed. Since a pattern of the light transmissive region of the mask body 1 is hole-like or slit-like, light easily experiences a diffraction phenomenon when passing therethrough. When light passes through the mask body 1 and the anti-diffraction film layer 2 successively, since the refractive index n of the anti-diffraction film layer 2 satisfies n>1 (i.e., the refractive index of the anti-diffraction film layer 2 is larger than that of the air), light has an effect of converging towards the light transmissive region after passing through the anti-diffraction film layer 2. Compared with the prior art where light directly irradiates a film layer to be exposed after passing through a mask body, the exposure mask according to the present invention can reduce the area of an exposed region of the film layer 3 to be exposed after exposure. Correspondingly, a resultant aperture is smaller, a resultant slit is narrower, or a resultant line has a smaller width, so that the fineness of a resultant pattern is higher. Therefore, the resolution of an image displayed by a display device can be improved.

Preferably, the step of forming a photoresist layer on a substrate includes: forming a black resin layer or a color resin layer for manufacturing a color filter on the substrate.

Preferably, in a case of forming a black resin layer on the substrate, the step of placing an exposure mask corresponding to a pattern to be formed on the photoresist layer above the photoresist layer includes: placing an exposure mask corresponding to a pattern of a black matrix to be formed above the substrate on which the black resin layer is formed, so that a region of the mask body of the exposure mask which corresponds to the pattern of the black matrix to be formed is a light transmissive region, and the remaining region of the mask body of the exposure mask is a light non-transmissive region;

the step of exposing the photoresist layer to light by using an exposure apparatus includes: exposing the black resin layer to light by using the exposure apparatus; and the step of forming the pattern on the exposed photoresist layer by a development process includes: performing a development process on the exposed black resin layer to form the pattern of the black matrix;

in a case of forming a color resin layer for manufacturing a color filter on the substrate, the step of placing an exposure mask corresponding to a pattern to be formed on the photoresist layer above the photoresist layer includes: placing an exposure mask corresponding to a pattern of a color filter to be formed above the substrate on which the color resin layer for manufacturing a color filter is formed, so that a region of the mask body of the exposure mask which corresponds to the pattern of the color filter to be formed is a light transmissive region, and the remaining region of the mask body of the exposure mask is a light non-transmissive region;

the step of exposing the photoresist layer to light by using an exposure apparatus includes: exposing the color resin layer for manufacturing a color filter to light by using the exposure apparatus; and the step of forming the pattern on the exposed photoresist layer by a development process includes: performing a development process on the exposed color resin layer for manufacturing a color filter to form the pattern of the color filter.

The display substrate may be a color-film substrate or an array substrate, wherein the array substrate is a COA substrate formed by using a technology in which a color filter is directly formed on an array substrate (Color filter On Array, which is simply referred to as COA).

Wherein, it should be noted that, the above substrate may be a blank glass substrate, a quartz substrate, a resin substrate or the like on which no film layer is coated or no pattern is formed; or the above substrate may be a semi-finished substrate provided with a certain film layer or pattern for manufacturing a color filter or a COA substrate; and the present invention is not limited thereto.

An embodiment of a method for manufacturing the display substrate is as follows:

forming a black matrix on a color-film substrate, wherein the smaller the linewidth of the black matrix is, the higher the resolution of a display device is. The black matrix is made of a black resin layer.

Specifically, the method includes the following steps:

Step 1: forming a black resin layer on a substrate, wherein the lithography nature of the black resin layer is similar to that of a negative photoresist layer, that is, an exposed region thereof can be reserved and an unexposed region thereof can be removed by development;

Step 2: placing an exposure mask corresponding to a pattern to be formed on the black resin layer above the black resin layer, so that a light transmissive retion of the exposure mask corresponds to a pattern of the black matrix to be formed on the color-film substrate, that is, the three-dimension size and the three-dimension shape of the pattern of the light transmissive region of the exposure mask are similar to those of the pattern of the black matrix;

Step 3: exposing the black resin layer to light by using an exposure apparatus, so that light emitted from the exposure apparatus passes through a light incident side and a light emergent side of the exposure mask and the black resin layer successively;

specifically, placing an exposure mask corresponding to a pattern of the black matrix to be formed above the substrate on which the black resin layer is formed, so that a region of the mask body of the exposure mask which corresponds to the pattern of the black matrix to be formed is a light transmissive region, and the remaining region of the mask body of the exposure mask is a light non-transmissive region; and Step 4: forming the pattern on the exposed black resin layer by a development process;

wherein, the exposure mask is any one of the exposure masks provided by the above embodiments.

With respect to the following different parameters, corresponding experiments are carried out according to the above manufacturing steps.

It is assumed that, the linewidth of a mask of the black matrix (BM) used in the following experiments is 6 μm.

Experiment 1:

A film layer of high reflective index is inserted between the mask and a glass substrate. The thickness of the film layer is 5 μm, and the reflective index of the film layer is 1.5. A black resin layer is subject to a prebake process, an exposure process, a development process, and the like. A detected linewidth of the BM is 7.7 μm.

Experiment 2:

A film layer of high reflective index is inserted between the mask and a glass substrate. The thickness of the film layer is 15 μm, and the reflective index of the film layer is 1.5. A black resin layer is subject to a prebake process, an exposure process, a development process, and the like. A detected linewidth of the BM is 7.1 μm.

Experiment 3:

A film layer of high reflective index is inserted between the mask and a glass substrate. The thickness of the film layer is 25 μm, and the reflective index of the film layer is 1.5. A black resin layer is subject to a prebake process, an exposure process, a development process, and the like. A detected linewidth of the BM is 6.5 μm.

Experiment 4:

A film layer of high reflective index is inserted between the mask and a glass substrate. The thickness of the film layer is 50 μm, and the reflective index of the film layer is 1.5. A black resin layer is subject to a prebake process, an exposure process, a development process, and the like. A detected linewidth of the BM is 5 μm.

Experiment 5:

A film layer of high reflective index is inserted between the mask and a glass substrate. The thickness of the film layer is 25 μm, and the reflective index of the film layer is 1.9. A black resin layer is subject to a prebake process, an exposure process, a development process, and the like. A detected linewidth of the BM is 6 μm.

Comparative Experiment 1:

No medium is inserted between the mask and a glass substrate of an exposure apparatus. A black resin layer is coated on a blank glass (i.e., the glass substrate), and is subject to a prebake process, an exposure process, a development process, and the like. A detected linewidth of the BM is 8 μm.

In the Experiments 1 to 5, the film layer of high reflective index is the anti-diffraction film layer 2 according to the present invention shown in FIG. 1.

It can be seen that, compared with the Comparative Experiment 1, the Experiments 1 to 5 can result in an obvious smaller linewidth (which is smaller than 8 μm) of the BM. In a case where a thicker anti-diffraction film layer is used in the Experiments 4, the linewidth of the BM is smaller and can be as small as 5 μm.

The above experiments have been described by taking manufacture of a black matrix as examples. If a via or a slit is to be formed, the via or the slit can be formed on a positive photoresist, and a light transmissive region of the mask corresponds to the via or the slit. The aperture of the resultant via or the width of the resultant slit will be smaller. Detailed description thereof is omitted.

With the mask and the method for manufacturing a display substrate according to embodiments of the present invention, it does not need to change the structures of an exposure apparatus and a mask in the prior art, and it only needs to arrange a detachable anti-diffraction film layer (i.e., a high reflective index film layer whose reflective index is larger than that of the air) under the mask. The exposure mask according to the present invention enables the area of an exposed region of a black resin layer or a color resin layer for manufacturing a color filter to be reduced after exposure. Correspondingly, a resultant aperture is smaller, a resultant slit is narrower, or a resultant line has a smaller width, so that the fineness of a resultant pattern is higher. Therefore, the resolution of an image displayed by a display device can be improved.

Obviously, various modifications and variations can be applied to the present invention by a person skilled in the art without departing from the spirit and scope of the present invention. These modifications and variations also fall within the protection scope of the present invention.

What is claimed is:

1. An exposure mask, including a mask body and an anti-diffraction film layer located at a light emergent side of the mask body, wherein,
    the mask body includes a light transmissive region and a light non-transmissive region;
    a region of the anti-diffraction film layer is a film layer whose entirety is light transmissive; and
    the anti-diffraction film layer is a film layer whose refractive index n satisfies n>1,
    wherein the anti-diffraction film layer is detachably connected to the mask body.

2. The exposure mask according to claim 1, wherein a refractive index n of the light transmissive region of the anti-diffraction film layer satisfies $1<n\leq10$.

3. The exposure mask according to claim 2, wherein the refractive index n of the light transmissive region of the anti-diffraction film layer satisfies $1<n\leq2$.

4. The exposure mask according to claim 1, wherein a thickness of the anti-diffraction film layer ranges from 1 μm to 300 μm.

5. The exposure mask according to claim 1, wherein the anti-diffraction film layer is an organic resin layer.

6. The exposure mask according to claim 1, wherein a distance between the anti-diffraction film layer and the mask body ranges from 50 μm to 200 μm.

7. A method for manufacturing a display substrate, including the following steps:
    a step of forming a photoresist layer on a substrate;
    a step of placing an exposure mask corresponding to a pattern to be formed on the photoresist layer above the photoresist layer;
    a step of exposing the photoresist layer to light by using an exposure apparatus, so that light emitted from the exposure apparatus passes through a light incident side and a light emergent side of the exposure mask and the photoresist layer successively; and
    a step of forming the pattern on the exposed photoresist layer by a development process;
    wherein, the exposure mask is the exposure mask according to claim 1.

8. The method according to claim 7, wherein the step of forming a photoresist layer on a substrate includes: forming a black resin layer or a color resin layer for manufacturing a color filter on the substrate.

9. The method according to claim 8, wherein,
    in a case of forming a black resin layer on the substrate,
    the step of placing an exposure mask corresponding to a pattern to be formed on the photoresist layer above the photoresist layer includes: placing an exposure mask corresponding to a pattern of a black matrix to be formed above the substrate on which the black resin layer is formed, so that a region of the mask body of the exposure mask which corresponds to the pattern of the black matrix to be formed is a light transmissive region, and the remaining region of the mask body of the exposure mask is a light non-transmissive region;
    the step of exposing the photoresist layer to light by using an exposure apparatus includes: exposing the black resin layer to light by using the exposure apparatus; and
    the step of forming the pattern on the exposed photoresist layer by a development process includes: performing a development process on the exposed black resin layer to form the pattern of the black matrix;
    in a case of forming a color resin layer for manufacturing a color filter on the substrate,
    the step of placing an exposure mask corresponding to a pattern to be formed on the photoresist layer above the photoresist layer includes: placing an exposure mask corresponding to a pattern of a color filter to be formed above the substrate on which the color resin layer for manufacturing a color filter is formed, so that a region of the mask body of the exposure mask which corresponds to the pattern of the color filter to be formed is a light transmissive region, and the remaining region of the mask body of the exposure mask is a light non-transmissive region;
    the step of exposing the photoresist layer to light by using an exposure apparatus includes: exposing the color resin layer for manufacturing a color filter to light by using the exposure apparatus; and
    the step of forming the pattern on the exposed photoresist layer by a development process includes: performing a development process on the exposed color resin layer for manufacturing a color filter to form the pattern of the color filter.

10. An exposure apparatus on which an exposure mask is arranged, wherein the exposure mask includes a mask body and an anti-diffraction film layer located at a light emergent side of the mask body, wherein, the mask body includes a light transmissive region and a light non-transmissive region;

a region of the anti-diffraction film layer is a film layer whose entirety is light transmissive; and the anti-diffraction film layer is a film layer whose refractive index n satisfies n>1, wherein the anti-diffraction film layer id detachably connected to the mask body.

11. The exposure apparatus according to claim 10, wherein a refractive index n of the light transmissive region of the anti-diffraction film layer satisfies $1<n\leq 10$.

12. The exposure apparatus according to claim 11, wherein the refractive index n of the light transmissive region of the anti-diffraction film layer satisfies $1<n\leq 2$.

13. The exposure apparatus according to claim 10, wherein a thickness of the anti-diffraction film layer ranges from 1 μm to 300 μm.

14. The exposure apparatus according to claim 10, wherein the anti-diffraction film layer is an organic resin layer.

15. The exposure apparatus according to claim 10, wherein a distance between the anti-diffraction film layer and the mask body ranges from 50 μm to 200 μm.

\* \* \* \* \*